US012638787B2

(12) United States Patent
Van De Kerkhof

(10) Patent No.: US 12,638,787 B2
(45) Date of Patent: May 26, 2026

(54) SUBSTRATE HANDLING SYSTEM OF A LITHOGRAPHY APPARATUS AND METHOD THEREOF

(71) Applicant: ASML Netherlands B.V., Veldhoven (NL)

(72) Inventor: Marcus Adrianus Van De Kerkhof, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 694 days.

(21) Appl. No.: 17/621,333

(22) PCT Filed: May 19, 2020

(86) PCT No.: PCT/EP2020/063962
§ 371 (c)(1),
(2) Date: Dec. 21, 2021

(87) PCT Pub. No.: WO2020/259930
PCT Pub. Date: Dec. 30, 2020

(65) Prior Publication Data
US 2022/0342322 A1        Oct. 27, 2022

(30) Foreign Application Priority Data

Jun. 28, 2019        (EP) ..................................... 19183180

(51) Int. Cl.
*G03F 7/00*          (2006.01)
*B65G 43/08*         (2006.01)
*H10P 72/76*         (2026.01)

(52) U.S. Cl.
CPC ......... *G03F 7/70733* (2013.01); *B65G 43/08* (2013.01); *G03F 7/707* (2013.01); *H10P 72/7612* (2026.01)

(58) Field of Classification Search
None
See application file for complete search history.

(56) References Cited

U.S. PATENT DOCUMENTS 5,677,824  A     10/1997   Harashima et al.
8,164,737  B2     4/2012   Butler et al.
(Continued)

FOREIGN PATENT DOCUMENTS

CN       109073990  A     12/2018
JP       H09148419  A     6/1997
(Continued)

OTHER PUBLICATIONS

Catherine Angioni, European International Searching Authority, International Search Report and Written Opinion, corresponding PCT Application No. PCT/EP2020/063962, mailed Aug. 18, 2020, 10 pages total.

*Primary Examiner* — Binu Thomas
(74) *Attorney, Agent, or Firm* — DiBerardino McGovern IP Group LLC

(57)                ABSTRACT

A substrate handling system comprising a substrate holder comprising a main body with a main body surface, and a plurality of burls projecting from the main body surface to support the substrate spaced apart from the main body surface, clamping means, the clamping means being configured to clamp and/or unclamp the substrate onto the substrate holder, and conveying means, the conveying means being configured to load and/or unload the substrate onto the substrate holder, wherein the conveying means is further configured to physically contact the substrate during the clamping and/or unclamping to the substrate holder. It is also described methods for clamping and unclamping a substrate, a computer program, a computer-readable medium and a lithography apparatus.

3 Claims, 11 Drawing Sheets

(56) References Cited

U.S. PATENT DOCUMENTS

| | | | |
|---|---|---|---|
| 8,970,822 B2 | 3/2015 | Kunnen et al. | |
| 9,897,928 B2 | 2/2018 | Kunnen et al. | |
| 2002/0141133 A1* | 10/2002 | Anderson | H01L 21/68742 |
| | | | 361/234 |
| 2006/0238953 A1* | 10/2006 | Hanawa | H01L 21/68742 |
| | | | 361/234 |
| 2007/0297118 A1 | 12/2007 | Fujii | |
| 2009/0033906 A1 | 2/2009 | Kumazaki | |
| 2009/0086187 A1 | 4/2009 | Compen et al. | |
| 2009/0122284 A1* | 5/2009 | Butler | G03F 7/70883 |
| | | | 355/53 |
| 2010/0032096 A1 | 2/2010 | Yu et al. | |
| 2010/0208409 A1 | 8/2010 | Bluck et al. | |
| 2011/0111601 A1* | 5/2011 | Okita | H01L 21/68742 |
| | | | 156/345.24 |
| 2012/0070996 A1 | 3/2012 | Hao | |
| 2019/0088518 A1 | 3/2019 | Koh et al. | |
| 2019/0113853 A1* | 4/2019 | Onvlee | G03F 7/70708 |
| 2020/0075369 A1* | 3/2020 | Potter | H01L 21/67259 |
| 2020/0365380 A1* | 11/2020 | Ueda | H01L 21/68742 |
| 2021/0223696 A1 | 7/2021 | Achanta et al. | |

FOREIGN PATENT DOCUMENTS

| | | | |
|---|---|---|---|
| JP | 2006332587 A | 12/2006 | |
| JP | 2009038231 A | 2/2009 | |
| JP | 2009105398 A | 5/2009 | |
| JP | 2010530636 A | 9/2010 | |
| JP | 2012164990 A | 8/2012 | |
| JP | 2019516137 A | 6/2019 | |
| KR | 2002-0088265 A | 11/2002 | |
| KR | 2007-0122481 A | 12/2007 | |
| KR | 20090071953 A | 7/2009 | |
| TW | 201310176 A | 3/2013 | |
| TW | 201314378 A | 4/2013 | |
| TW | 201827931 A | 8/2018 | |
| WO | 9900837 A1 | 1/1999 | |
| WO | 2006116577 A2 | 11/2006 | |
| WO | 2008156367 A1 | 12/2008 | |
| WO | WO-2017182216 A1 * | 10/2017 | G03F 7/70691 |

* cited by examiner

PRIOR ART

SUBSTRATE HANDLING SYSTEM OF A LITHOGRAPHY APPARATUS AND METHOD THEREOF

CROSS-REFERENCE TO RELATED APPLICATIONS

This application is the U.S. National Stage Application of International Application No. PCT/EP2020/063962, filed on May 19, 2020, which claims priority of EP Application Serial No. 19183180.9 which was filed on Jun. 28, 2019 and which is incorporated herein in its entirety by reference.

FIELD

The present invention relates to a substrate handling system of a lithography apparatus and a method for reducing the wear or erosion of a substrate holder during the unloading and the loading of a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A substrate holder having a plurality of burls to support the substrate is commonly used in a lithographic apparatus. The substrate is conventionally clamped to the substrate holder during exposures. The clamping may be performed by using electrostatic force or vacuum force. An example of a substrate may be wafer. Other substrates, such as patterning devices, may be also clamped to a support structure using said clamping techniques.

In some systems, the clamping and unclamping of the substrate onto the substrate holder may be stiff and undamped. The clamping surface may be the surface wherein the substrate is clamped and/or unclamped. The clamping process requires low and high friction during clamping. Low friction is required to minimize loading stresses and deformation which may otherwise result in overlay issues. High friction is required to maximize the grip and ensure that there is no displacement of the substrate with respect to the clamping surface during scanning accelerations of the substrate holder.

Further during substrate clamping or unclamping, vibrations may occur wearing away or eroding the substrate holder. More particularly, the plurality of burls may be worn away or eroded. This wear or erosion reduces the flatness of the clamping surface. If the clamping surface is not flat, the number of focus errors and the overlay between the patterned layers on the wafer will be increased.

SUMMARY

An object of the present invention is to provide an improved substrate handling system which reduces the wear or erosion of the components of the substrate handling system.

It is a further object of the present invention to reduce the number of focus errors during the exposure and to reduce the overlay between the patterned layers.

In a first aspect of the present invention it is provided a substrate handling system comprising
- a substrate holder comprising a main body with a main body surface, and a plurality of burls projecting from the main body surface to support the substrate spaced apart from the main body surface,
- clamping means, the clamping means being configured to clamp and/or unclamp the substrate onto the substrate holder, and
- conveying means, the conveying means being configured to load and/or unload the substrate onto the substrate holder, wherein the conveying means is further configured to physically contact the substrate during the clamping and/or unclamping to the substrate holder.

The conveying means may be movable at least between an extended position, wherein their upper ends extend above the substrate holder, and a retracted position, wherein their upper ends are retracted inside the substrate holder. Either the retracted position or the extended position are different positions with respect to the position wherein the conveying means are in contact with the substrate. For sake of clarity, this latter position of the conveying means may be referred as contact position.

Therefore, the conveying means are configured to be positioned in a contact position during the clamping and/or unclamping to the substrate holder. In said contact position, the conveying means are physically in contact with the wafer.

During the loading of the substrate on the substrate holder, a robot may load the substrate on the conveying means, being the conveying means located on the extended position. Since the substrate is received on the conveying means extending above the plurality of burls, the robot can be withdrawn leaving the substrate on the conveying means. Then, the conveying means may be moved to the retracted position to place the substrate on the plurality of burls. In said retracted position, the conveying means are not in contact with the substrate.

After the loading, the substrate is clamped by the clamping means to the substrate holder in order to avoid any displacement during the exposure. The surface of the substrate holder where the substrate is clamped is the clamping surface. Once the exposure has been completed, the substrate is unclamped from the substrate holder. This means that the clamping means release the substrate. Finally, the substrate is unloaded from the substrate holder by the conveying means. In particular, the conveying means may be moved to the extended position.

When the substrate is clamped or unclamped to the substrate holder, the substrate may vibrate on the plurality of burls. Said vibrations may wear or erode the plurality of burls reducing the flatness of the clamping surface. It should be noted that the clamping and unclamping of the substrate are different processes than the loading and the unloading of the substrate. Therefore, the clamping and unclamping processes take place until the substrate stops vibrating, or the vibrations on the substrate are significantly reduced.

Advantageously, the system of the present invention reduces said vibrations through the conveying means during the clamping and/or unclamping process. Further during the clamping, as the conveying means are in contact with the substrate, the conveying means are configured to counteract the force of gravity providing zero load force or normal force on the plurality burls during the clamping. Further, the present invention reduces the wear or erosion of the substrate holder. The substrate holder may be used in a lithography apparatus.

The substrate maybe a wafer or a reticle. The present invention may be also useful in reflective reticles which are placed on a substrate holder. In said embodiments, the substrate holder may be a reticle holder of a mask holder.

In one embodiment, the conveying means is configured to detect vibrations on the substrate caused by the clamping and/or unclamping of the substrate to the substrate holder.

In one embodiment, the conveying means is further configured to position the substrate in a vibration position during the unclamping, wherein in said vibration position the substrate is located separately from the plurality of burls. In the vibration position, the substrate may be in the free space, which means that the substrate does not touch the plurality of burls.

Either the retracted position or the extended position or the contact position are different positions with respect to the vibration position or the position of vibration of the substrate. For sake of clarity, the extended position may be referred as first position, the retracted position may be referred as second position, the contact position may be referred as third position and the vibrating position may be referred as fourth position.

In this embodiment, the substrate vibrates separately from the plurality of burls. This means that the substrate vibrates in the free space without interacting with the plurality of burls, which advantageously avoids any wear or erosion of said plurality of burls. This helps to maintain the flatness of the clamping surface.

In one embodiment, the substrate is electrostatically clamped to the substrate. In this embodiment, the clamping means provides a electrostatic force between the main body surface and the substrate. The electrostatic force clamps the substrate to the substrate holder. The electrostatic force may be generated in the main body surface, more particularly in the spaces between the plurality of burls of the main body surface.

In one embodiment, the unclamping is produced during the ramp-down of a electrostatic force clamping generator. Thus, the clamping means is the electrostatic force clamping generator. During said ramp-down, as the substrate comes loose from the main body, it may start to vibrate due to internal stresses and lack of damping. Therefore, during the ramp-down the conveying means are configured to be in contact with the substrate reducing the vibrations. Further, in this embodiment during said ramp-down, the conveying means are further configured to continuously push the substrate up. Once, the electrostatic force generator is off, the substrate is released and is continuously moved to said vibration position by the conveying means. In said vibration position or forth position, the substrate may be still under the effects of the unclamping, such as vibrations.

In one embodiment, the conveying means comprises force feedback sensor means. In a further embodiment, the conveying means is configured to position the substrate in the vibration position when the force feedback sensor means detects a force caused by the unclamping. In an alternative or additional embodiment, the conveying means comprises a conveying means controller, and wherein the conveying means is configured to position the substrate in the vibration position when the conveying means controller detects a force caused by the unclamping. In other embodiment, the force detected may be the release of the substrate, therefore the conveying means may be configured to detect the release of the substrate by using the force feedback sensor means and/or the conveying means controller.

The vibrations on the substrate transmit mechanically a force to the conveying means. By the detecting the force caused by the unclamping into the substrate, the above embodiments advantageously reduce the amount of time wherein the substrate is vibrating on the plurality of burls, and therefore, said embodiments reduce the wear or erosion of the plurality of burls.

In one embodiment, the conveying means is configured to detect a reduction of vibrations of the substrate during the clamping, and separating the conveying means from the substrate. In a further embodiment, the force feedback sensor means is configured to detect the reduction of vibrations. In a different embodiment, the conveying means controller is configured to detect the reduction of vibrations.

In the above embodiments, a reduction of the force from the substrate to the conveying means is detected. This allows separating the conveying means in the correct moment from the substrate reducing any unnecessary stress in the surface of the substrate which may damage it.

In one embodiment, the conveying means comprises a plurality of pins and motor means, preferably, the conveying means comprises at least three pins. In a further embodiment, the motor means comprises a servo actuator configured to provide at least 100 Hz of force feedback control. In an additional embodiment, the plurality pins are coated with a damping material, preferably, the damping material is Polyether ether ketone, i.e., PEEK. In an embodiment, the system further comprises gas dispenser means configured to dispense at least one gas to at least the main body surface, preferably, the gas is hydrogen or nitrogen. In other embodiment, the gas dispenser means is configured to fill the volume between the clamping surface and the substrate with the gas. In another embodiment, the system comprises damping means for damping the contact of the substrate with the plurality of burls, preferably, the damping means may comprise a gas damper and/or a magnetic damper.

The above embodiments advantageously reduce the vibrations suffered in the substrate increasing the reduction of the wear or erosion of the plurality of burls. Regarding the used gas in the gas dispenser means, hydrogen is preferred in EUV lithography apparatus because its cleaning properties. With respect to nitrogen, it is preferred in deep ultraviolet (DUV) lithography apparatus because it is an inert gas and it is not flammable.

In a second aspect of the present invention it is provided a method for unclamping a substrate comprising unclamping the substrate and bringing into contact conveying means to the substrate during the unclamping and, during the unclamping, moving to a vibration position the substrate by the conveying means, wherein in said vibration position, the substrate is separated from the plurality of burls.

As the vibrations due to the unclamping occur in the free space without interacting with the plurality of burls, the wear or erosion of the plurality of burls is reduced.

In one embodiment, the method further comprises: before moving the substrate to the vibration position, detecting a release of the substrate. In an additional embodiment, the detection is performed by using force feedback measurement or by a conveying means controller. The conveying means controller may be connected to the conveying means, and therefore, it may have the same functionalities of the conveying means controller described in the embodiments of the first inventive aspect.

In the case of the conveying means moves the substrate to the vibration position before the unclamping, the substrate may suffer a stress force which will damage its surface. Advantageously, the above embodiments separate the substrate from the plurality of burls in the correct moment avoiding any damage to the substrate.

In one embodiment, the speed of the movement to the vibration position is equal or greater than 10 mm/s. Advantageously, this embodiment reduces the amount of time wherein the substrate is vibrating on the plurality of burls, reducing their wear or erosion.

Additionally, any of the embodiments of the method according to the second aspect of the invention may use the substrate handling system according to any of the embodiments of the first aspect of the invention.

In a third aspect of the present invention, it is provided a method for clamping a substrate comprising clamping the substrate and bringing into contact conveying means to the substrate during the clamping.

Advantageously, bringing into contact the conveying means during the unclamping reduces the vibrations suffered by the substrate and reduces the wear or erosion of the plurality of burls.

In one embodiment, the method further comprises: detecting a reduction of vibrations of the substrate by the conveying means, and separating the conveying means from the substrate. In another embodiment, the reduction of vibrations of the substrate is detected by a force feedback measurement or by a conveying means controller.

Once the vibrations suffered by the substrate during clamping are reduced, the risk of wear or erosion of the plurality of burls is also reduced. In the above embodiments a reduction of the force from the substrate to the conveying means is detected. This allows separating the conveying means in the correct moment from the substrate reducing any unnecessary stress in the surface of the substrate which may damage it.

Additionally, any of the embodiments of the method according to the third aspect of the invention may use the substrate handling system according to any of the embodiments of the first aspect of the invention.

In a fourth aspect of the present invention, it is provided a computer program comprising instructions to cause the system of any of the embodiments of the first aspect of the invention to execute the steps of the any of the methods of any the embodiments of the second and third aspects of the invention. In a fifth aspect of the invention it is provided a computer-readable medium having stored thereon the computer program described on the forth aspect of the invention.

In a sixth aspect of the invention it is provided a lithography apparatus comprising the system of any of the embodiments of the first aspect of the invention and/or the computer-readable medium of the fifth aspect of the invention.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings, in which.

DETAILED DESCRIPTION

Figure 1:
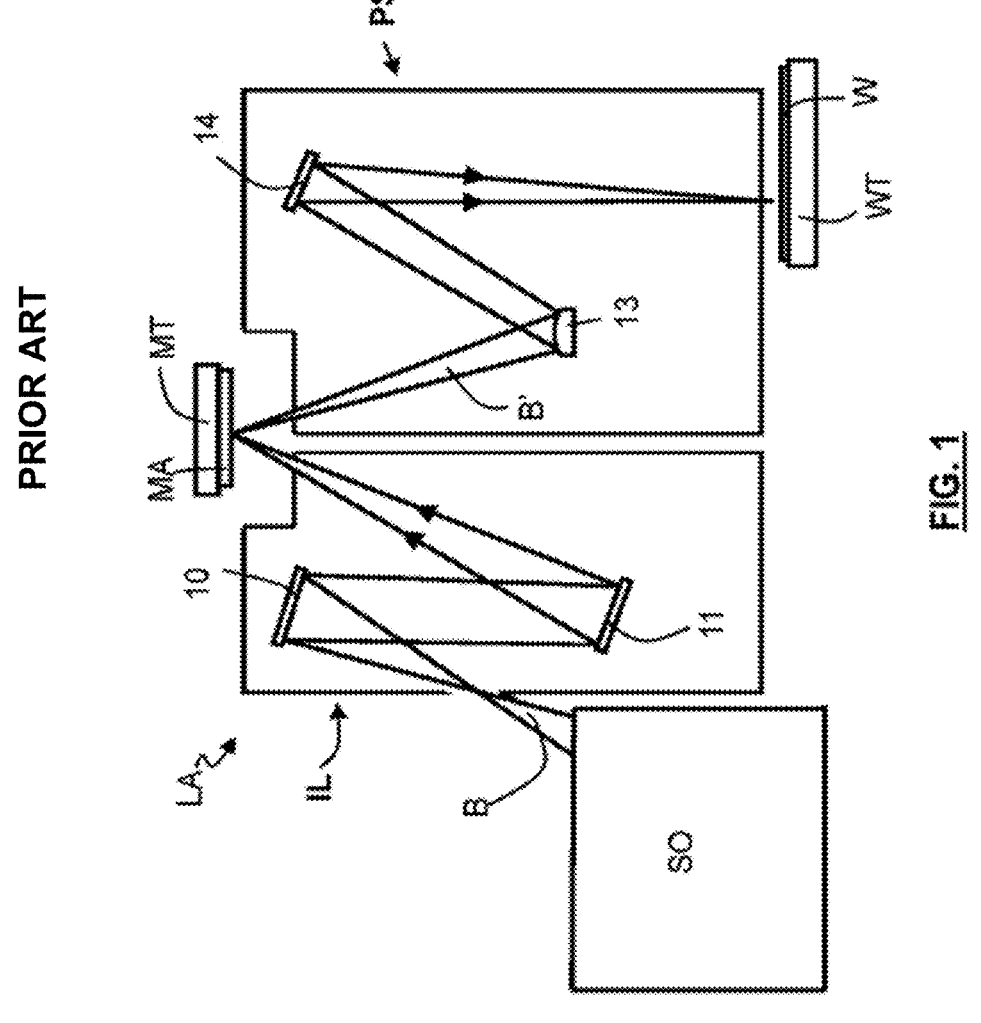
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate holder WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate holder WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2:
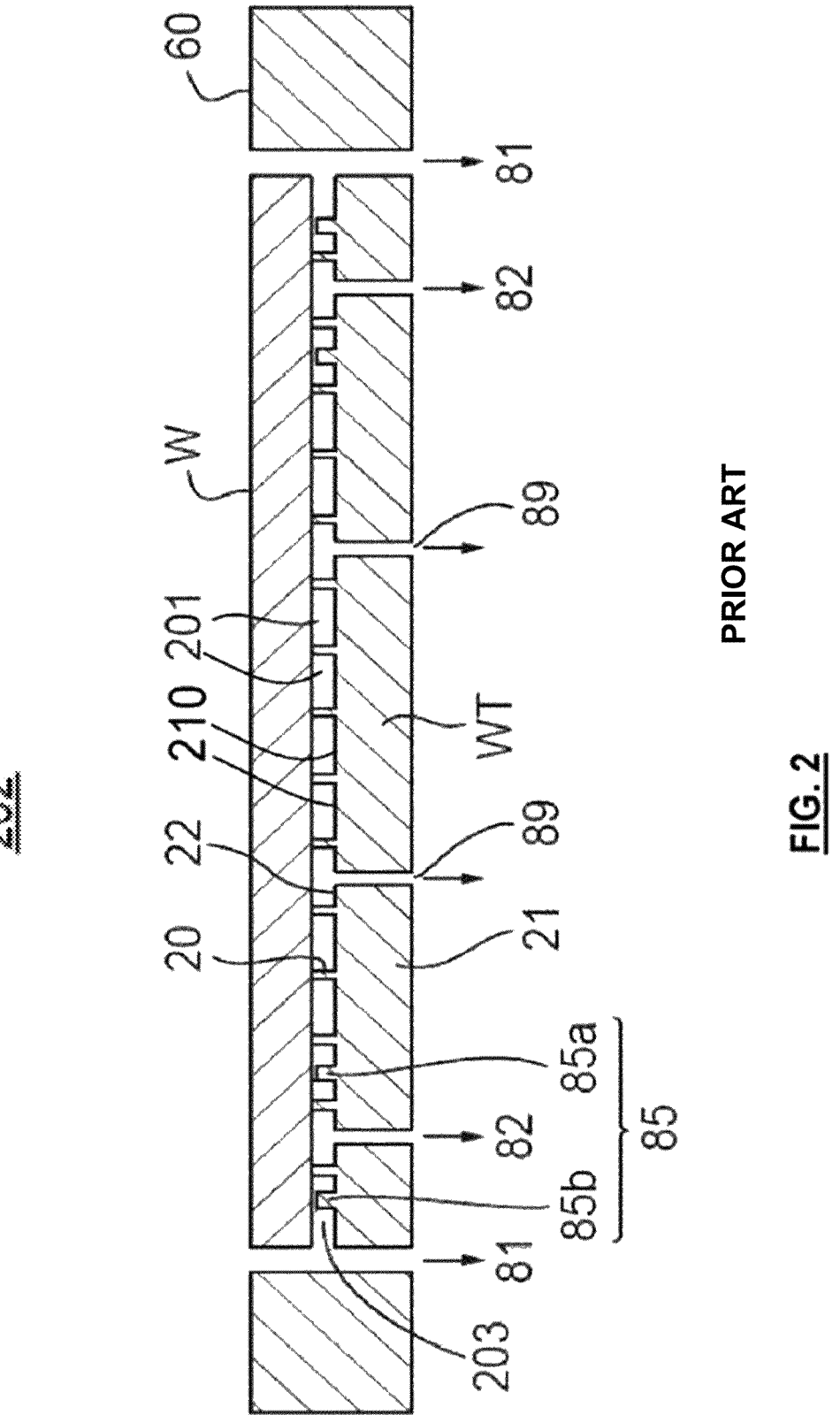
FIG. 2 depicts in cross-section a substrate holder and substrate in a conventional lithographic apparatus.

FIG. 2 depicts a substrate holder WT forming part of the lithography apparatus LA. Substrate holder WT has the same shape in plan as a substrate, e.g. circular, and is substantially the same size as a substrate, e.g. 300 mm or 450 mm in diameter. Substrate holder WT comprises a main body 21 having a main body surface 22 and a plurality of burls 20 projecting from the main body surface 22. At least one section 210 of the main body surface 22 located between the plurality of burls 20 may be configured to clamp and/or unclamp the substrate W. In an embodiment, burls 20 have a height in the range of from 100 μm to 500 μm, e.g. about 150 μm. A substrate W can be supported by the distal end surfaces of burls 20, which conform to a substantially flat support plane to support the substrate W in a flat state. For example, main body 21 and burls 20 may be formed of SiSiC, a ceramic material having silicon carbide (SiC) grains in a silicon matrix.

A plurality of through-holes are formed in the main body 21. Through-holes 89 allow the conveying means (not shown in FIG. 2) to project through the substrate holder WT to receive the substrate W and allow the space between the substrate W and the substrate holder WT to be evacuated by connection to a clamp under pressure. Other structures, e.g. to control gas flow and/or thermal conductivity between the substrate holder WT and the substrate W, can be provided.

In one embodiment wherein the substrate holder WT is configured to perform a vacuum clamp of the substrate W to the plurality of burls 20, an edge seal 85 is provided near the periphery of substrate holder WT. Therefore, the clamping means are configured to provide a vacuum clamp by modifying the pressure on the surrounding areas of the substrate W. The substrate W is clamped to the substrate holder WT by connecting clamp openings 89 to a clamp under-pressure so that spaces 201 is at a lower pressure than the space 202 above substrate W. Thus, the clamping means is configured to modify the pressure in spaces 201 and 202. Hence atmospheric pressure above the substrate W holds it firmly onto substrate holder WT.

Therefore, the clamping force, in this case vacuum force, may be generated in the main body surface, more particularly in the spaces 201 between the plurality of burls 20 of the main body surface. Sections 210 represents the area of the main body surface the clamping force may be performed. Thus, at least one section 210 of the main body surface 22 located between the plurality of burls 20 is configured to clamp and/or unclamp the substrate. Edge seals 85a, 85b project upwardly from the substrate holder WT to minimize the gap between the substrate holder WT and substrate W to minimize the flow of air from the surroundings into the space underneath substrate W and hence reduce the load on the clamp under-pressure. Burls 20 can be provided in the region between edge seals 85a, 85b.

Edge seal 85 is a pair of projecting edge seal ridges 85a, 85b around the outside of substrate holder WT. Edge seal ridges 85a, 85b have a height slightly shorter, e.g. by about 10 μm, than that of the burls 20 so that they do not contact the substrate W but reduce the gas flow into the space 201 between the substrate W and substrate holder WT so as to improve vacuum clamping. Burls 20 can be provided in the region between edge seal ridges 85a, 85b; in FIG. 2 none are shown but it is possible to have one or more rows of burls in this region. The substrate holder WT can also be provided with electronic components, e.g. heaters and sensors, to control the temperature of the substrate holder WT and substrate W.

Openings 81 and 82 are configured to house the conveying means (not shown in FIG. 2) which are intended to load and unload the substrate W on the substrate holder WT.

As alternative of providing a vacuum clamping, the substrate holder is configured to electrostatically clamp the substrate W to the plurality of burls 20. In this case, a voltage, provided by the clamping means, is applied to the main body surface 22. More particularly, the clamping means provides an electrostatic force to the spaces between the plurality of burls of the main body surface. Sections 210 represent the area of the main body surface the clamping force may be performed. Thus, at least one section 210 of the main body surface 22 located between the plurality of burls 20 is configured to clamp and/or unclamp the substrate. This sections 210 may be also named as free area of burls 210. The at least one section 210 of the main body surface 22 located between the plurality of burls 20 or the free area of burls electrostatically attracts and clamps the substrate W. Therefore, the at least one section 210 of the main body surface 22 located between the plurality of burls 20 or the free area of burls is configured to electrostatically clamp and/or unclamp the substrate. In the embodiment of FIG. 2, it could be also used this electrostatically clamping scheme.

The at least one section of the main body surface located between the plurality of burls may be understood as the section or area of the main body surface where the plurality of burls are not projected from the main body surface. In other words, the at least one section of the main body surface located between the plurality of burls is the section or area of the main body surface where the plurality of burls are absent.

Figure 3:
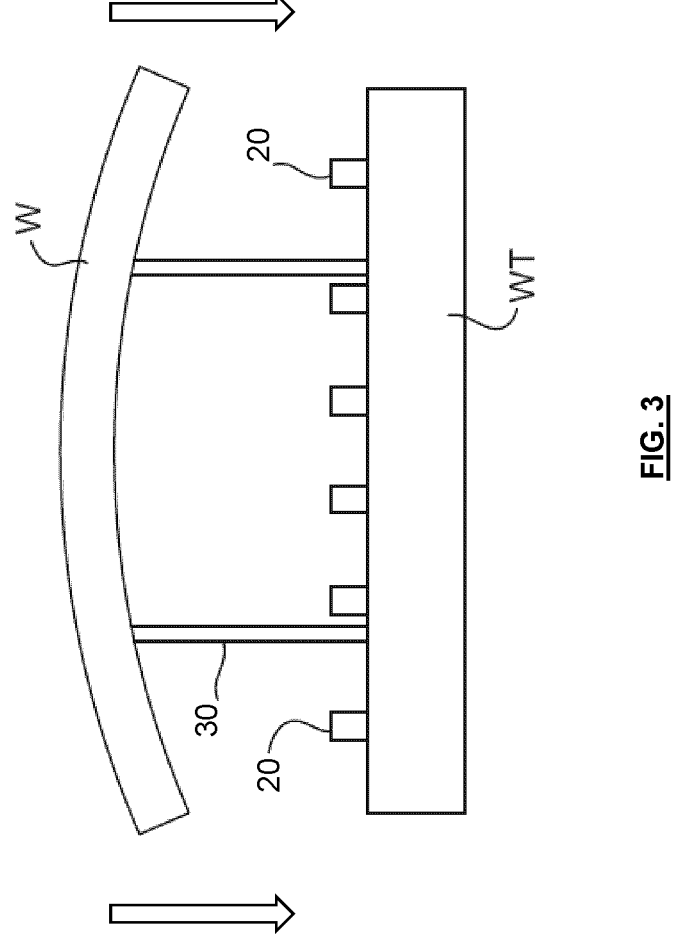
FIG. 3 depicts in cross-section the working operation of the conveying means during the loading.
Figures 4A, 4B:
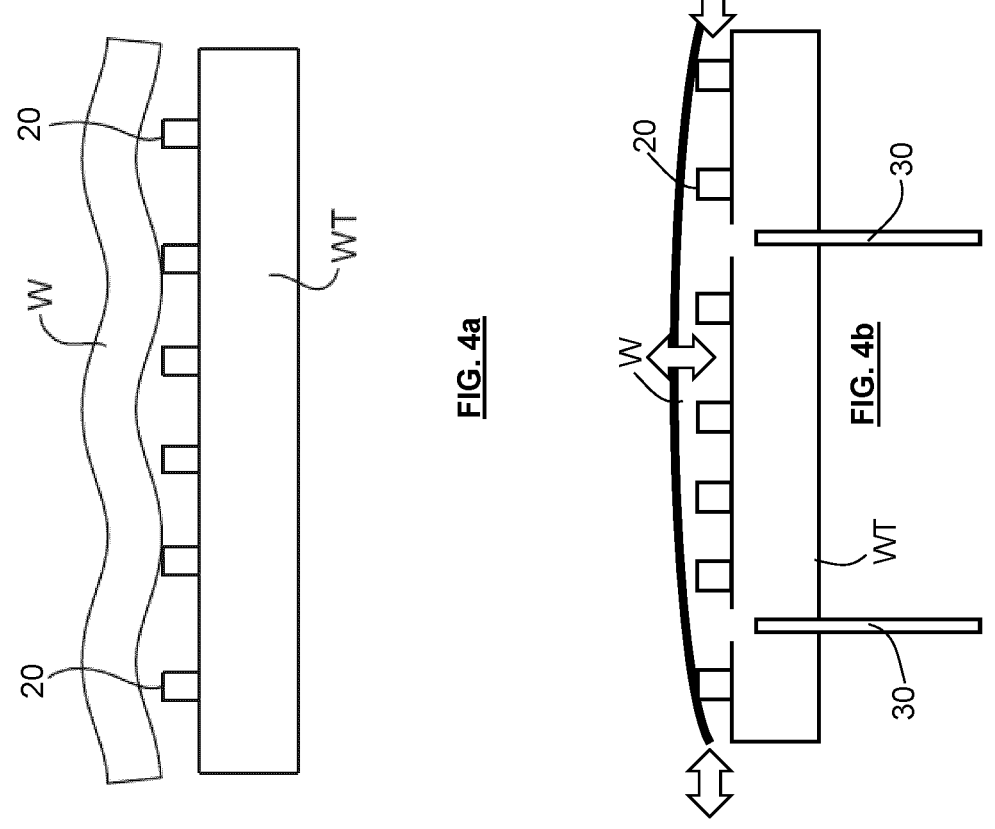
FIGS. 4a and 4b depict in cross-section the wear or erosion of the plurality of burls of the substrate holder of FIG. 2 due to the clamping and unclamping of a substrate.

FIG. 3 shows how the substrate W is loaded on the substrate table WT. It can also be appreciated that the conveying means is in an extended position or a first position. After receiving the substrate W by the conveying means 30, the conveying means 30 may be moved to a retracted position or second position to place the substrate on the plurality of burls 20. In FIG. 4b, the conveying means are in the retracted position, or second position, and housed inside the substrate holder WT. Then, before the exposure the substrate W is clamped, and after the exposure the substrate W is unclamped in order to be unloaded from the substrate table WT.

Especially during unclamping but also during clamping, the substrate may suffer high friction wearing the plurality of burls, and more particularly, the burls located under the outer part of the substrate as it is shown in FIG. 4b. Because of the stiff and undamped wafer-clamp system, this change on the wafer shape is accompanied by multiple wafer oscillations as it is shown in FIG. 4a, which may lead to deformation issues in the surface of the substrate W. If the substrate W is a wafer, this will be lead to an overlay issues between its layers.

Figure 5:
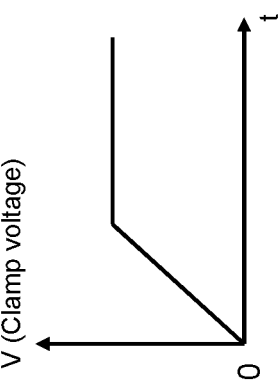
FIG. 5 depicts in cross-section the working operation during clamping of the substrate handling system of the present invention.
Figure 5:
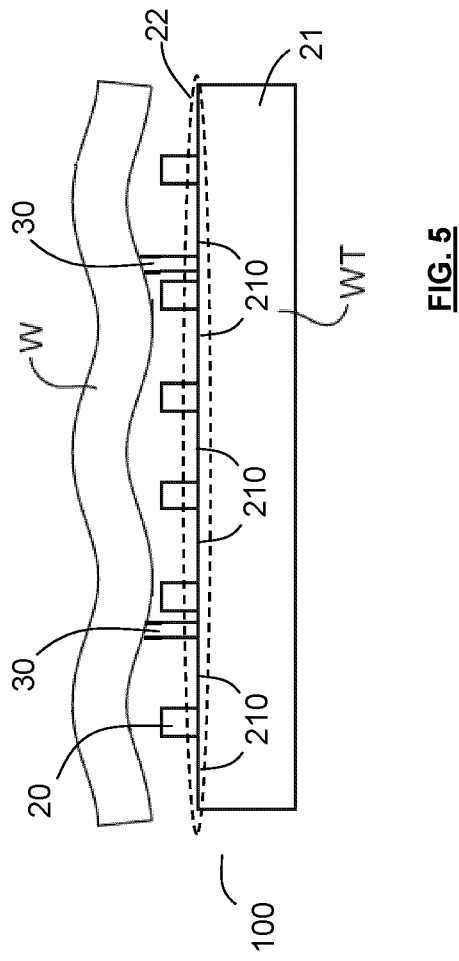
Figure 6:
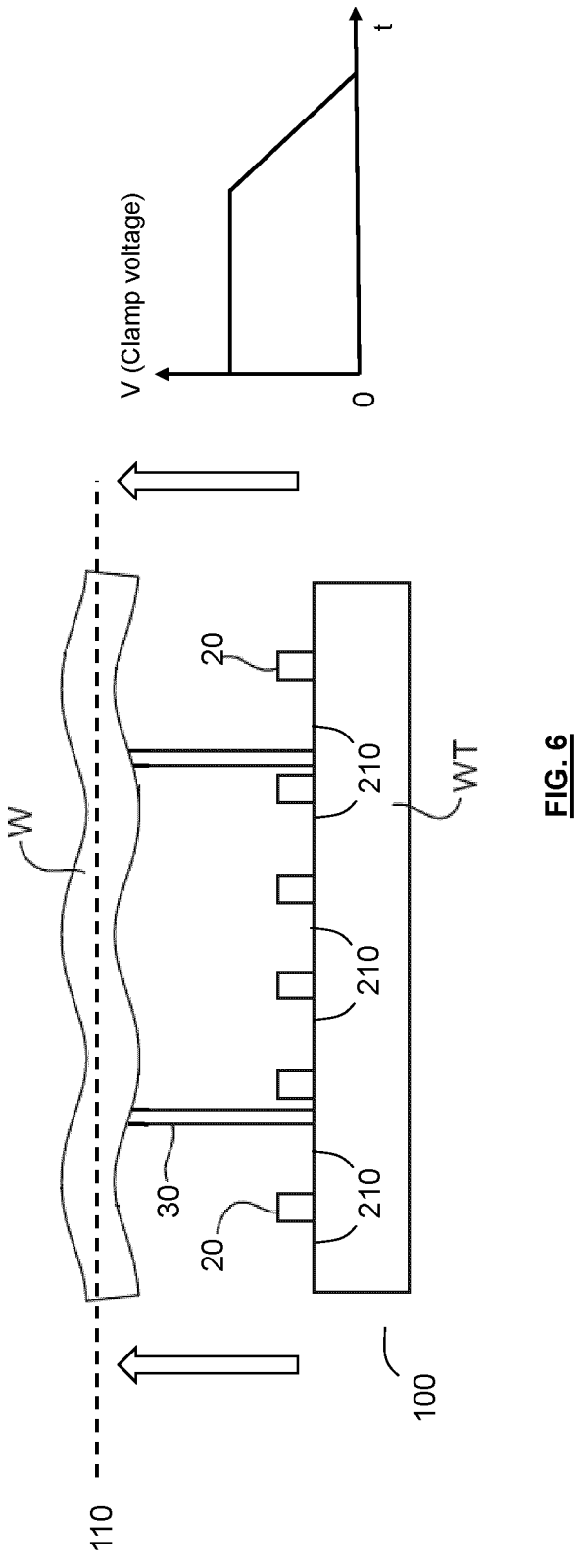
FIG. 6 depicts in cross-section the working operation during unclamping of the substrate handling system of the present invention.

In FIGS. 5 and 6, it is shown a substrate handling system 100 according to one embodiment of the present invention which prevents the wear shown in FIGS. 4a and 4b. In this embodiment, the substrate W is a wafer, however this example does not limit to the invention for this type of substrates. Further, substrate handling system 100 is configured to electrostatically clamp and/or unclamp the substrate W.

The substrate handling system 100 of FIGS. 5 and 6 comprises a substrate holder WT. The substrate holder WT comprises a main body 21 with a main body surface 22. Further, the substrate holder WT comprises a plurality of burls 20 projecting from the main body surface 22 to support the substrate W spaced apart from the main body surface 22. The at least one section 210 of the main body surface 22 located between the plurality of burls 20 may be configured to clamp and/or unclamp the substrate.

Further the substrate handling system 100 comprises clamping means, the clamping means being configured to clamp and/or unclamp the substrate onto the substrate holder WT, and it 100 also comprises conveying means 30 configured to load and/or unload the substrate W onto the substrate holder WT and to detect vibrations on the substrate W. The conveying means 30 is configured to physically contact the substrate W during the electrostatically clamping and/or unclamping to the substrate holder WT.

As it is shown in FIG. 5, the conveying means is positioned in a contact position or third position. This contact position is different than the extended position and retracted position of the prior art respectively shown in FIGS. 3 and 4b.

Advantageously, the present invention reduces the vibrations on the substrate W during clamping and/or unclamping. During the electrostatically clamping, as it is show in the right side of FIG. 5, the conveying means 30 is configured to keep in physically contact with the substrate W and to gently push against backside as it is shown in the left part of FIG. 5.

During the electrostatically unclamping, i.e., during the ramp-down of the clamping voltage as it is shown in the right side of FIG. 6, the conveying means 30 is configured to contact with the substrate W and to gently push against backside. Further, the conveying means 30 is further configured to detect the release of the substrate by measuring the vibrations on it, also during the ramp-down of the clamping voltage, and then the conveying means 30 is configured to push up the substrate W, so the substrate edge vibrations occur in free space rather than on the plurality of burls 20. In one embodiment the release of the substrate starts when the clamping voltage is reduced.

More particularly, the conveying means 30 is configured to position the substrate W in a vibration position 110 or forth position during the unclamping, wherein in said vibration position 110 the substrate is located separately from the plurality of burls 20. It may also be said that the substrate is located in the free space from the plurality of burls 20, as it is shown in FIG. 6. The speed of the movement to the vibration position is 10 mm/s or more. Once the substrate W is totally released, for example, the clamping voltage is zero volts, the conveying means are configured to maintain the substrate W in the vibration position until a reduction of vibration is detected and/or the vibrations have stopped, i.e., until the unclamping is finished.

Figure 7:
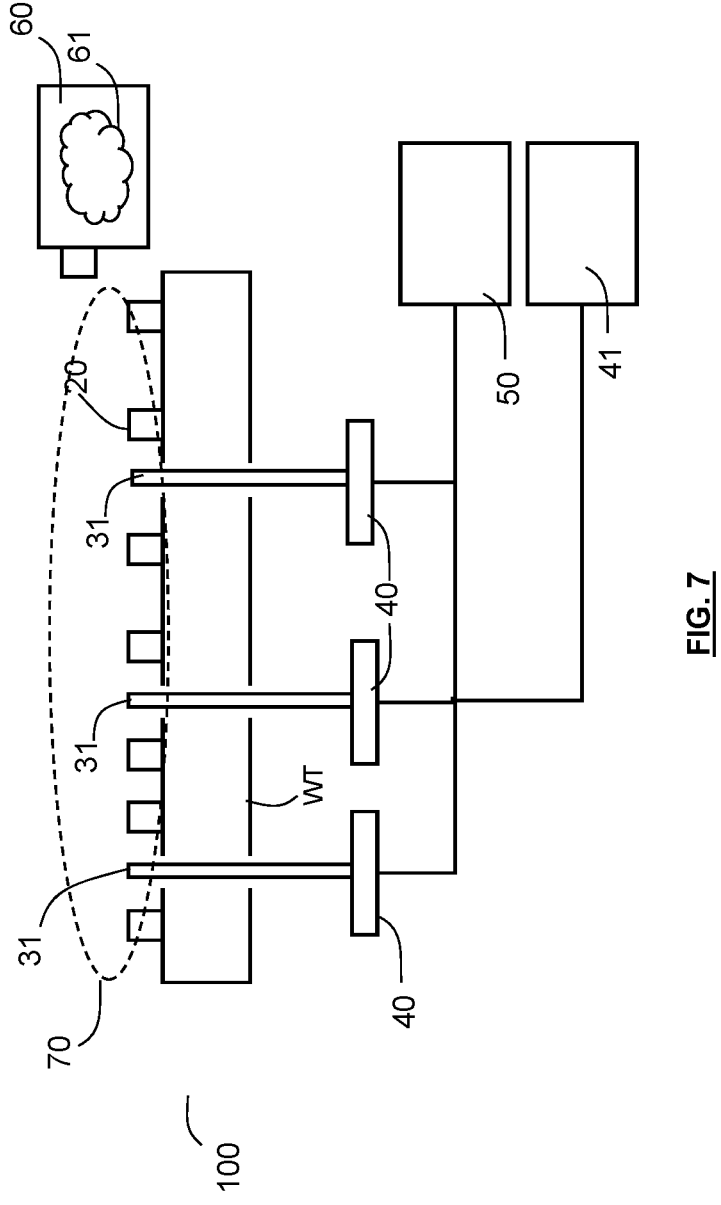
FIG. 7 depicts another embodiment of the substrate handling system of the present invention.

FIG. 7 describes a further embodiment of the substrate handling system 100 according to the present invention. As it can be appreciated, this embodiment comprises some of the elements of the system of FIGS. 5 and 6 and for the sake of simplicity, they will not be explained again.

The conveying means 30 of the substrate handling system 100 of FIG. 7 comprises three pins 31, three electrical motors 40, one force feedback sensor 50 and a conveying means controller or motor controller 41. Also in this embodiment, the electrical motors 40 are configured to position the substrate W through the pins 31 in the vibration position 110 when the force feedback sensor 50 detects any force or vibration caused by the unclamping.

In other embodiment, the motor controller 41 is configured to detect any force or vibration caused by the electrically unclamping and to send an instruction to the electrical motors 40 to position the substrate W through the pins 31 in the vibration position 110.

Further, it is also proposed to introduce additional damping into the pins, either by making the pins out of damping material like PEEK, or by introducing electromagnetic damping to the actuation part of the pin, or by servo-actuation configured to provide at least 100 Hz of force feedback control. Alternatively, dedicated actuated damping pins, rings, or other shapes/structures could be used for this purpose.

These embodiments may also be performed either with backfill gas between the plurality of burls 20. For that purpose, in the embodiment of FIG. 7, the substrate handling system 100 further comprises a gas dispenser 60. The gas dispenser 60 is configured to dispense at least one gas to at least the main body surface. In other words, the gas dispenser 60 is configured to fill the volume 70 between the clamping surface and the substrate with hydrogen 61. Advantageously, the backfill gas 61 could be beneficial to give some additional damping just after unclamping.

Figure 8A:
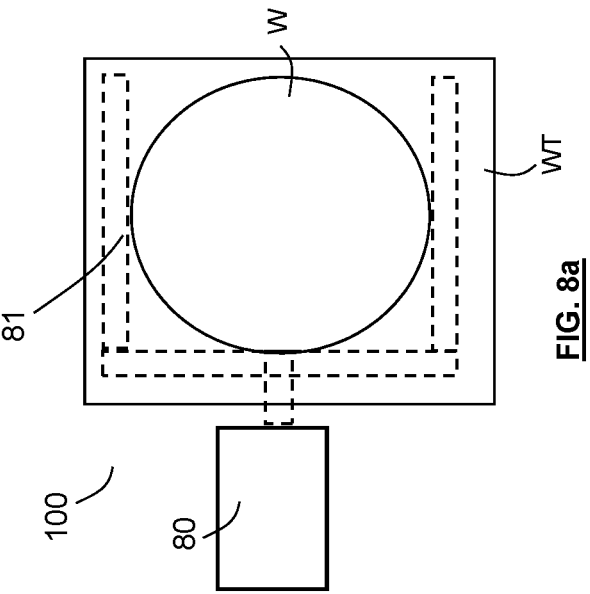
FIGS. 8a and 8b depict another embodiment of the conveying means of the substrate handling system of the present invention.

In an alternative embodiment the conveying means may be an external device. FIG. 8a depicts an aerial view said embodiment. The conveying means comprises a external robot 80 with a griping hand 81 configured to load and unload the substrate W onto the substrate holder WT. In other embodiment, the external robot is configured to load and unload the substrate onto the pins 31. In an additional embodiment, the external robot 80 is configured to load and unload the substrate onto the plurality of burls 20.

In the embodiment of FIG. 8a, it is also depicted in dashed lines the location of the griping hand 81 in flush with the substrate W, i.e., it may be located in a parallel plane or in the same plane of the substrate. In this embodiment, the external robot 80 is configured to grip the substrate W from said planes. Additionally, the griping hand 81 may grip by physical contact, preferably using at least one wedge, or by electrostatic force the substrate W.

Figure 8B:
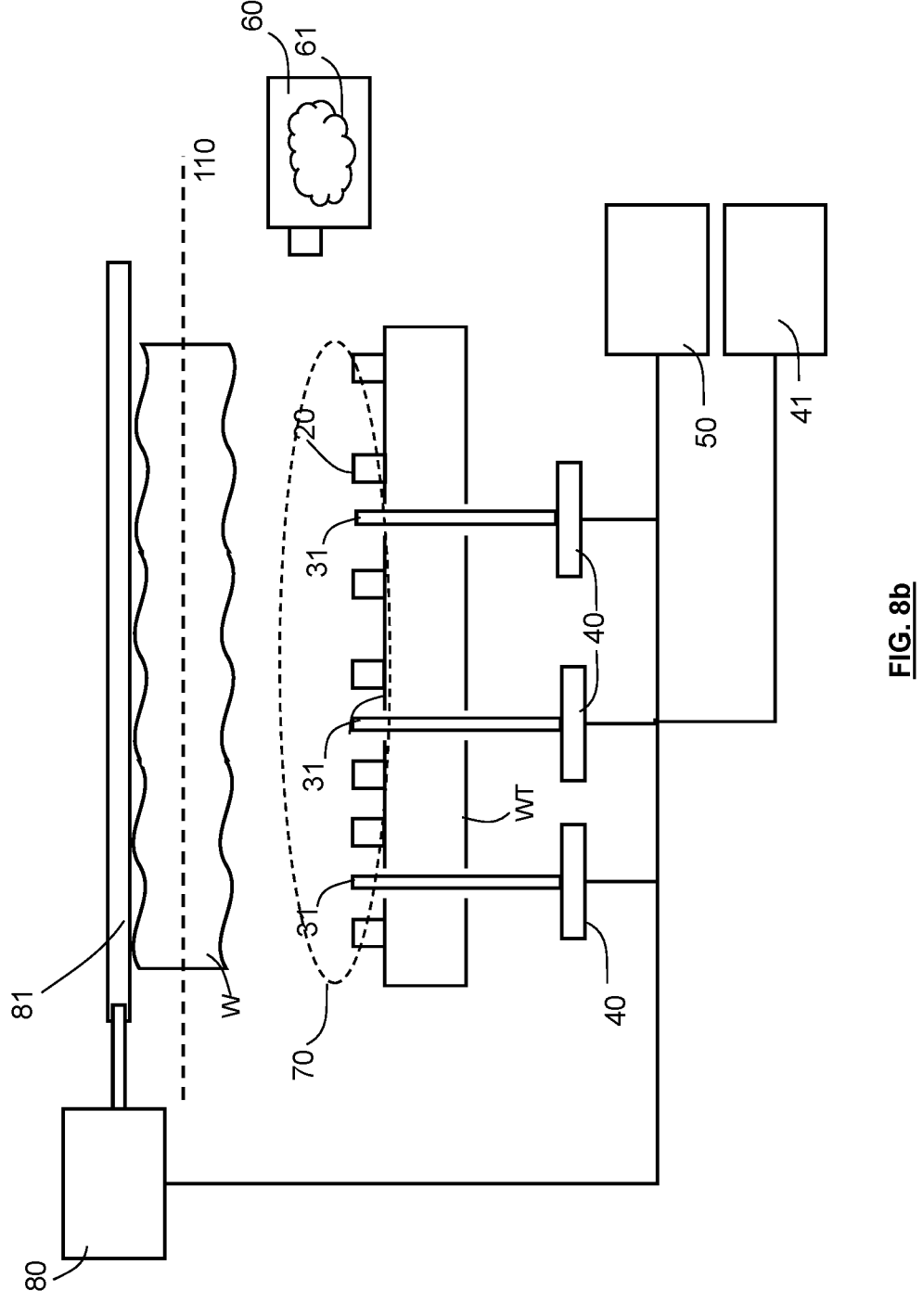

In the embodiment of FIG. 8b, the griping hand 81 is located above the substrate W. In this embodiment the external robot 80 is configured to grip the substrate W from said position. In particular, the griping hand 81 may also grip by physical contact, preferably using at least one wedge, or by electrostatic force the substrate W.

In any of the embodiments wherein the conveying means 30 comprises the external robot 80, the external robot 80 may be used in any of the handling system depicted in FIGS. 5 to 7. In particular as it is shown in FIG. 8b, the external robot is 80 may be connected to the motor controller 41 and to the force feedback sensor 50. The motor controller 41 is also configured to detect any force or vibration caused by the unclamping and to send an instruction to the external robot 80 to position the substrate in a vibration position 110 during the unclamping. As in the previous embodiments, in said vibration position 110, the substrate is located separately with respect to the plurality of burls 20.

Further the motor controller 41 is also configured to detect any force or vibration caused by the clamping and to send an instruction to the external robot 80 to contact the substrate reducing the vibrations on the substrate W. Advantageously, the external robot 80 allows to perform more complicated clamping schemes (e.g. differential forces over time in different positions) without overcomplicating primary function of substrate holder WT.

In any of the embodiments of FIGS. 5 to 8b, the conveying means 30, either the pins 31 or the external robot 80 with a griping hand 81, is configured to keep the substrate W at zero normal load force during the clamping.

Figure 9A:
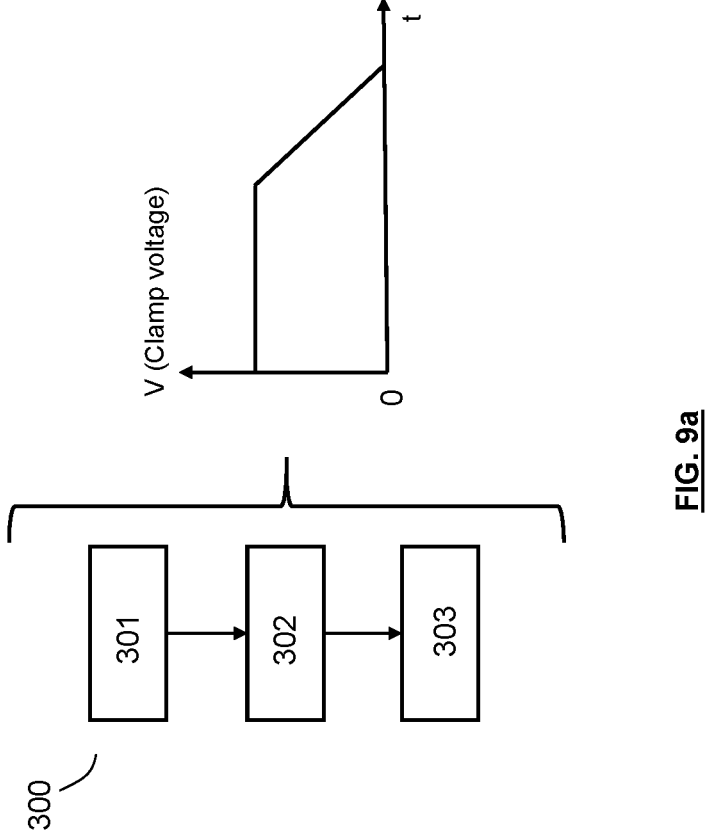
FIGS. 9a and 9b respectively depict a flow diagram of the method for reducing the wear or erosion during clamping and unclamping of the present invention.

FIG. 9a depicts a flow diagram of a method 300 for unclamping a substrate W. The method 300 is performed during the electrical unclamping as it is represented in the right part of the FIG. 9a. The method 300 comprises electrically unclamping 301 the substrate W and bringing 301 into contact conveying means 30 to the substrate W during said unclamping. This means during the ramp down of the clamping voltage, the conveying means 30 are brought in to contact with the substrate W. Further, the release of the substrate W is detected 302 by using force feedback measurement or by the conveying means controller 40. Once it is released during the unclamping, i.e., the clamping voltage is close to 0 V but it still clamped, the substrate W is moved 303 to a vibration position 110 the substrate by the conveying means 30, wherein in said vibration position 110, the substrate W is separated from the plurality of burls 20.

Figure 9B:
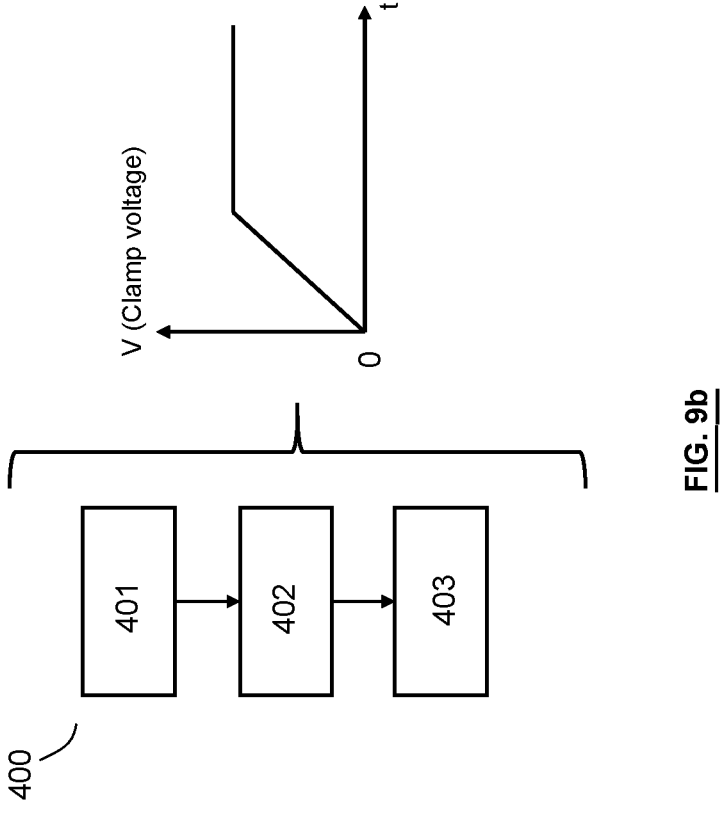

FIG. 9b depicts a flow diagram of a method 400 for reducing clamping a substrate W. The method 400 is performed during the electrical clamping as it is represented in the right part of the FIG. 9b. The method 400 comprises the step 401 of electrically clamping the substrate W and simultaneously bringing into contact the conveying means 30 to the substrate W during the clamping. This means during the ramp up of the clamping voltage, the conveying means are brought in to contact with the substrate W. Further, the reduction of vibrations is detected 402 by using force feedback measurement or by the conveying means controller 40. Once it is detected during the clamping, i.e., the clamping voltage is close to optical clamping voltage, the conveying means 30 are separated 403 from the substrate W.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below. Other aspects of the invention are set-out as in the following numbered clauses.

1. A substrate handling system comprising
   a substrate holder comprising a main body with a main body surface, and a plurality of burls projecting from the main body surface to support the substrate spaced apart from the main body surface,
   clamping means, the clamping means being configured to clamp and/or unclamp the substrate onto the substrate holder, and
   conveying means, the conveying means being configured to load and/or unload the substrate onto the substrate holder,
   wherein the conveying means is further configured to physically contact the substrate during the clamping and/or unclamping to the substrate holder.
2. The system of clause 1, wherein the conveying means is further configured to position the substrate in a vibration position during the unclamping, wherein in said vibration position the substrate is located separately from the plurality of burls.
3. The system of any of the previous clauses, wherein the conveying means comprises force feedback sensor means.
4. The system of clause 3, wherein the conveying means is configured to position the substrate in the vibration position when the force feedback sensor means detects a force caused by the unclamping.
5. The system of any of the previous clauses wherein the conveying means comprises a conveying means controller, and wherein the conveying means is configured to position the substrate in the vibration position when the conveying means controller detects a force caused by the unclamping.

6. The system of any of the previous clauses wherein the conveying means comprises a plurality of pins and motor means.

7. The system of clause 6 wherein the motor means comprises a servo actuator configured to provide at least 100 Hz of force feedback control.

8. The system of any of the clauses 6 or 7, where the plurality pins are coated with a damping material, preferably, the damping material is Polyether ether ketone.

9. The system of any of the previous clauses further comprising gas dispenser means configured to dispense at least one gas to at least the main body surface, preferably, the gas is hydrogen or nitrogen.

10. The system of any of the previous clauses further comprising damping means for damping the contact of the substrate with the plurality of burls, preferably, the damping means comprises a gas damper and/or a magnetic damper.

11. The system of any of the previous clauses wherein the conveying means is further configured to detect a reduction of vibrations of the substrate during the clamping, and separating the conveying means from the substrate.

12. The system of clauses 3 and 11 wherein the force feedback sensor means is configured to detect the reduction of vibrations.

13. The system of clauses 5 and 11 wherein the conveying means controller is configured to detect the reduction of vibrations.

14. A method for unclamping a substrate comprising unclamping the substrate and bringing into contact conveying means to the substrate during the unclamping and,
during the unclamping, moving to a vibration position the substrate by the conveying means, wherein in said vibration position, the substrate is separated from the plurality of burls.

15. The method according to clause 14 comprising, before moving the substrate to the vibration position, detecting a release of the substrate.

16. The method according to clause 15, where the detection is performed by using force feedback measurement or by a conveying means controller.

17. The method according to any of the clauses 14 to 16, wherein the speed of the movement to the vibration position is equal or greater than 10 mm/s.

18. A method for clamping a substrate comprising clamping the substrate and bringing into contact conveying means to the substrate during the clamping.

19. A method according to clause 18, further comprising detecting a reduction of vibrations of the substrate by the conveying means, and separating the conveying means from the substrate.

20. The method according to any of the clauses 18 or 19, wherein the reduction of vibrations of the substrate is detected by a force feedback measurement or by a conveying means controller.

21. A computer program comprising instructions to cause the system of any of the clauses 1 to 13 to execute the steps of any of the methods of any of the clauses 14 to 20.

22. A computer-readable medium having stored thereon the computer program of clause 21.

23. A lithography apparatus comprising the system of any of the clauses 1 to 13 and/or the computer-readable medium of clause 22.

The invention claimed is:

1. A substrate handling system comprising:
a substrate holder comprising a main body with a main body surface, and a plurality of burls projecting from the main body surface to support a substrate spaced apart from the main body surface;
clamping means, the clamping means being configured for clamping the substrate to and/or unclamping the substrate from the substrate holder; and
conveying means, the conveying means being configured
  to load the substrate on and/or unload the substrate from the substrate holder,
  to physically contact the substrate during clamping the substrate to and/or unclamping the substrate from the substrate holder, and
  to position the substrate in a vibration position during the unclamping, wherein in the vibration position the substrate is located separately from the plurality of burls,
the conveying means comprising a conveying means controller configured to detect a reduction of vibrations of the substrate, the conveying means being configured to position the substrate in the vibration position when the conveying means controller detects the reduction of vibrations of the substrate.

2. A substrate handling system comprising:
a substrate holder comprising a main body with a main body surface, and a plurality of burls projecting from the main body surface to support a substrate spaced apart from the main body surface;
clamping means, the clamping means being configured for clamping the substrate to and/or unclamping the substrate from the substrate holder;
damping means for damping the contact of the substrate with the plurality of burls wherein the damping means comprises a gas damper and/or a magnetic damper; and
conveying means, the conveying means being configured
  to load the substrate on and/or unload the substrate from the substrate holder,
  to physically contact the substrate during clamping the substrate to and/or unclamping the substrate from the substrate holder, and
  to position the substrate in a vibration position during the unclamping, wherein in the vibration position the substrate is located separately from the plurality of burls,
the conveying means comprising a conveying means controller, the conveying means being configured to detect a reduction of vibrations of the substrate during the clamping when separating the conveying means from the substrate.

3. A substrate handling system comprising:
a substrate holder comprising a main body with a main body surface, and a plurality of burls projecting from the main body surface to support a substrate spaced apart from the main body surface;
clamping means, the clamping means being configured for clamping the substrate to and/or unclamping the substrate from the substrate holder; and
conveying means, the conveying means being configured
  to load the substrate on and/or unload the substrate from the substrate holder, to physically contact the substrate during clamping the substrate to and/or unclamping the substrate from the substrate holder, and to position the substrate in a vibration position during the unclamping, wherein in the vibration position the substrate is located separately from the plurality of burls, the conveying means comprising a conveying means controller, the conveying means being configured to position the substrate in the vibration position when the conveying means controller detects release of the substrate by measuring vibrations on the substrate, wherein the conveying means further comprises a force feedback sensor means configured to detect a reduction of the vibrations.

* * * * *